(12) United States Patent
Sugawara

(10) Patent No.: US 6,191,439 B1
(45) Date of Patent: Feb. 20, 2001

(54) SEMICONDUCTOR LIGHT EMITTING DEVICE

(75) Inventor: Hideto Sugawara, Kawasaki (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/351,897

(22) Filed: Jul. 13, 1999

(30) Foreign Application Priority Data

Jul. 14, 1998 (JP) .................................................. 10-198835

(51) Int. Cl.$^7$ ..................................................... H01L 33/00

(52) U.S. Cl. ................................ 257/103; 257/95; 257/97

(58) Field of Search ................................ 257/103, 95, 97

(56) References Cited

U.S. PATENT DOCUMENTS

| | | | |
|---|---|---|---|
| 5,247,533 | 9/1993 | Okazaki et al. | 372/45 |
| 5,300,788 | * 4/1994 | Fan et al. . | |
| 5,751,752 | 5/1998 | Shakuda . | |
| 5,981,978 | * 11/1999 | Mushiage et al. . | |

FOREIGN PATENT DOCUMENTS

| | | |
|---|---|---|
| 0803 916 A2 | 4/1997 | (EP) . |
| 99113649 | 6/2000 | (EP) . |
| 09312442 | 2/1997 | (JP) . |

OTHER PUBLICATIONS

Masahiko Inamori, et al., "Direct Patterning of the Current Confinement Structure for p–Type Column–III Nitrides by Low–Energy Electron Beam Irradiation Treatment," Jpn. J. Appl. Phys., vol. 34, Pt. 1, No. 2B, pp. 1190–1193, 1995.

* cited by examiner

*Primary Examiner*—Stephen D. Meier
(74) *Attorney, Agent, or Firm*—Hogan & Hartson, LLP

(57) ABSTRACT

An object of the present invention is to provide a semiconductor light emitting device that an emission efficiency is high and it is possible to emit lights at an ultraviolet wave length. The semiconductor light emitting device according to the present invention is constituted by laminating a buffer layer, an n-GaN contact layer, a clad layer including n-AlGaN, a GaN active layer, a clad layer including p-AlGaN, and a p-GaN contact layer on a sapphire substrate. Each portion of the clad layer including n-AlGaN, the GaN active layer 5, the clad layer including p-AlGaN, and the p-GaN contact layer is eliminated by etching; as a result, the n-GaN contact layer 3 is exposed. Next, An n-side electrode for current injection is formed on the n-GaN contact layer 3. Next, an n-GaN current block layer 9 is formed on a portion of an upper face of the p-GaN contact layer 7. Next, a p-side electrode for current injection is formed on upper faces of the p-GaN contact layer and the n-GaN current block layer. The GaN active layer is set to a thickness equal to or more than 50 nm. An current injection area injected via the electrode for current injection is set equal to or less than $5 \times 10{-4}$ cm$^2$.

18 Claims, 5 Drawing Sheets

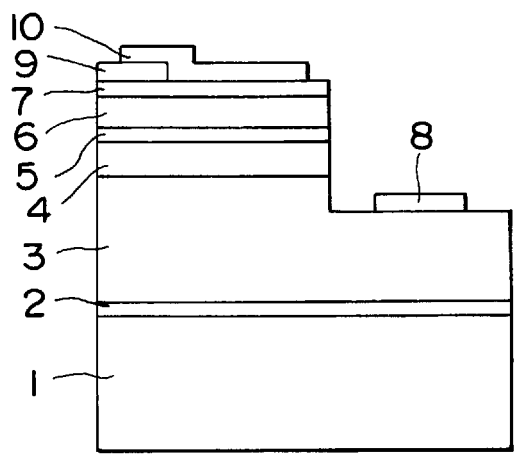
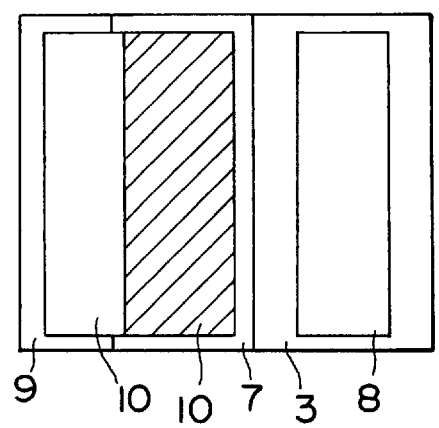
FIG. 1a    FIG. 1b
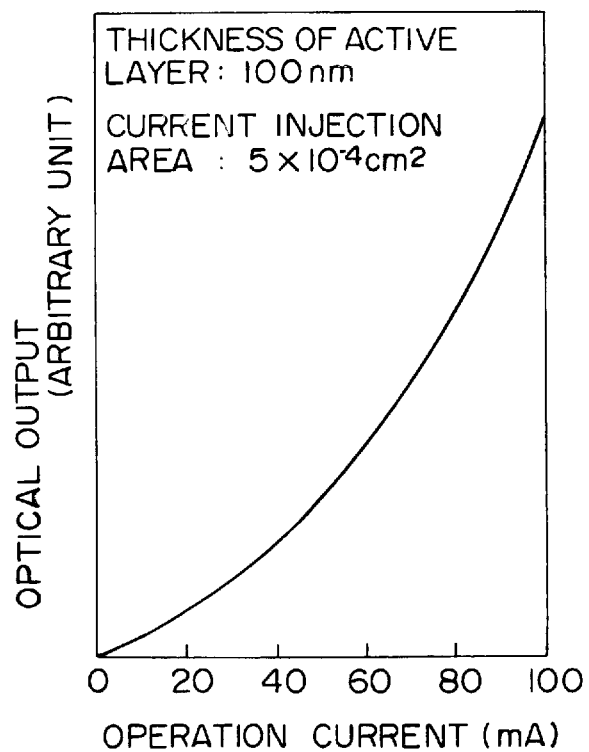
FIG. 2

SEMICONDUCTOR LIGHT EMITTING DEVICE

BACKGROUND OF THE INVENTION

1. Field of the Invention

The present invention relates to a structure of semiconductor including nitride which emits lights due to a transition of band-to-band of an active layer.

2. Related Background Art

Because an optical transition of semiconductors including a gallium nitride, i.e. InAlGaN, is a direct transition, it is possible to allow lights to efficiently emit and recombine. Furthermore, because a transition energy of the semiconductors including a gallium nitride is widely ranged from 2 to 6.2 eV, the semiconductors are developed as efficient light emitting device materials such as a semiconductor laser or a high-luminance visible LED (Light Emitting diode). Furthermore, semiconductors including gallium nitride has a feature that it is possible to emit lights at an ultraviolet wave length as III–V compound diodes. Accordingly, it may possible to replace conventional ultraviolet luminants with the semiconductors including gallium nitride.

A band-gap energy of InxGa1-xN, which is one type of the semiconductors including gallium nitride, is variable by changing an indium (In) composition x. Because of this, it is possible to use the InxGa1-xN as an active layer for avisible light emitting device.

At this time, a LED, of which a light emitting layer is a mix crystal made of InGaN, is realized, and a semiconductor laser which oscillates by a current injection is realized.

However, an optical mechanism of the LED, of which the active layer is formed of a crystal that a constituent ratio x is high, where x is equal to or less than 0.05, is different from the optical mechanism of a crystal that the constituent ratio x is low. In order to realize efficient ultraviolet LED, it is desirable to improve electric properties by improving a method for allowing the crystals to grow and an device structure.

SUMMARY OF THE INVENTION

An object of the present invention is to provide a semiconductor light emitting device that it is possible to efficiently emit lights and to allow lights in an ultraviolet wave length region to efficiently emit.

In order to achieve the foregoing object, a semiconductor light emitting device, comprising:
 an active layer in a thickness equal to or more than 50 nm; and
 a semiconductor including nitride which has a stacked structure and is arranged at both sides of said active layer,
  wherein a current injection area of said semiconductor including nitride is equal to or less than $5 \times 10^{-4}$ cm$^2$, and
  lights are emitted due to a transition of band-to-band of said active layer.

According to the present invention, in a semiconductor light emitting device for allowing lights to emit by injecting a current into a semiconductor including nitride which sandwiches an active layer and has a stacked structure, a thickness of the active layer is set equal to or more than 50 nm, and a current injection area is set equal to or less than $5 \times 10^{-4}$ cm$^2$. Because of this, it is possible to obtain a semiconductor light emitting device capable of efficiently emitting lights at an ultraviolet wave length.

Furthermore, a semiconductor light emitting device, comprising:
 a buffer layer formed on a sapphire substrate;
 an n-GaN contact layer formed on said buffer layer;
 an n-AlGaN clad layer formed on said n-GaN contact layer;
 an active layer formed on said n-AlGaN clad layer;
 a p-AlGaN clad layer formed on said active layer;
 a p-GaN contact layer formed on said p-AlGaN clad layer;
 a current block layer formed on a portion of said p-GaN contact layer;
 an n-side electrode formed on said n-GaN contact layer, said n-side electrode being separated from said n-AlGaN clad layer; and
 a p-side electrode formed on said p-GaN contact layer and said current block layer,
  wherein a thickness of said active layer is equal to or more than 50 nm, and
  said p-side electrode has an area equal to or less than $5 \times 10^{-4}$ cm$^2$, except for a region overlapping with said n-GaN current block layer.

BRIEF DESCRIPTION OF THE DRAWINGS

FIG. 1a is a cross sectional view of a first embodiment, and FIG. 1b is a top view of the first embodiment;

FIG. 2 is a diagram showing a relationship between an operational current and an optical output;

DESCRIPTION OF THE PREFERRED EMBODIMENTS

Figure 3:
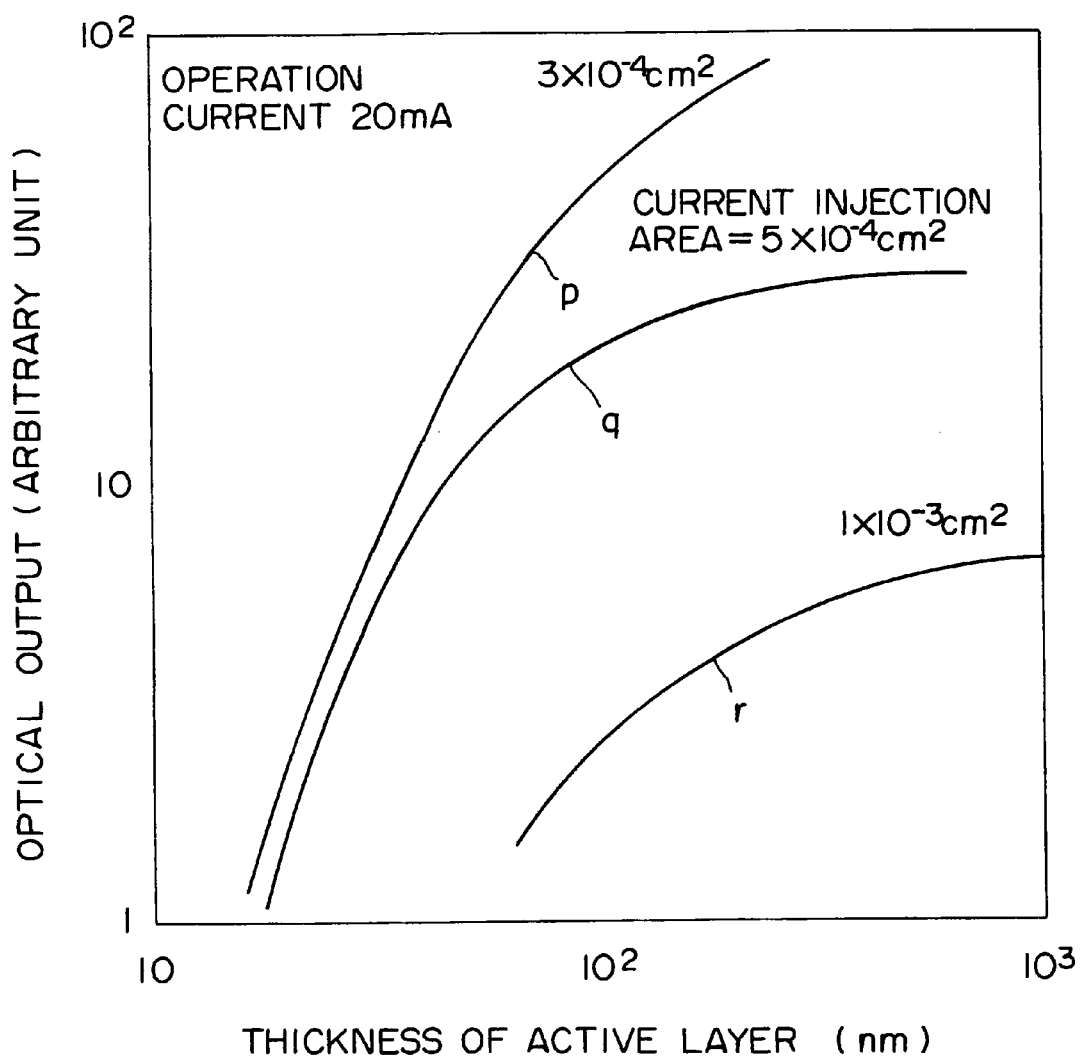
FIG. 3 is a diagram showing a relationship between a thickness of the active layer (nm) and the optical output.

A semiconductor light emitting device will be described in detail with reference to the attached drawings as follows.

First Embodiment

FIG. 1a is a cross sectional view of a first embodiment of a semiconductor light emitting device according to the present invention, and FIG. 1b is a top view of the first embodiment. The semiconductor light emitting diode of FIG. 1 is constituted by growing a buffer layer 2, an n-GaN contact layer 3, a clad layer 4 including n-AlGaN (n-AlyGa1-yN), a GaN active layer 5, a clad layer 6 including p-AlGaN (p-AlyGa1-yN), and ap-GaNcontact layer 7 in this order on a sapphire substrate 1.

Each portion of the clad layer 4 including n-AlGaN, the GaN active layer 5, the clad layer 6 including p-AlGaN, and the p-GaN contact layer 7 are eliminated in order to form a mesa type (surface contact type) of device. As a result, a portion of the n-GaN contact layer 3 is exposed. Next, an n-side electrode 8 for current injection is formed on an upper face of the exposed n-GaN contact layer 3.

Furthermore, an n-GaN current block layer 9 is formed on a portion of an upper face of the p-GaN contact layer 7. A p-side electrode 10 for current injection is formed on upper faces of the p-GaN contact layer 7 and the n-GaN current block 9. The current is injected to a p-side region from the upper face of the p-GaN contact layer 7, except for a portion covered by the n-GaN current block layer 9. A region not overlapping the n-GaN current block layer 9 in the p-side electrode 10 corresponds to a current injection area.

In the first embodiment, film thickness of each of the clad layer 4 including n-AlyGa1-yN and the clad layer 6 including p-AlyGa1-yN is set to 0.2 $\mu$m, and mix crystal ratio y of Al is set to 0.2. A film thickness of the GaN active layer 5 is set to 100 nm.

Next, electrical properties of the semiconductor light emitting diode of FIG. 1 will be explained as follows. Hereinafter, a mono silane is used as a n type impurity, and a bis cyclopentane diphenyl magnesium is used as a p type impurity.

In the semiconductor light emitting diode of FIG. 1, the current injected via the electrodes 8 and 10 for the current injection leads to transition of band-to-band in the active layer, and via this transition, the device emits lights in the ultraviolet region.

FIG. 2 is a diagram showing a relationship between an operational current and an optical output on condition that applies a forward bias for the semiconductor light emitting diode of FIG. 1. As shown in FIG. 2, even if the operational current reaches 100 MA, saturation of the optical output due to overflow of an injected carrier and Joule heat does not occur. Because of this, the emission efficiency at the operational current 20 MA, which is normally used, becomes low. This shows there is a problem in design of the devices.

Normally, in such a case, an improvement for thinning a thickness of the GaN active layer 5 and narrowing the current injection region is conducted. Generally, a most suitable value of a thickness of the active layer is about a diffusion length of an injection carrier, and the devices are designed so that dispersion of the injection carrier is reduced.

However, carrier mobility of undraped GaN is 700 cm$^2$/Vsec, and when a lifetime of the carriers is lnsec, the diffusion length of the carrier is assumed to be about 1.3 $\mu$m. That is, it is predicted that the diffusion length of the carriers is considerably longer than a thickness of the active layer 5.

FIG. 3 is a diagram showing a relationship between a thickness of the active layer (nm) and the optical output on condition that fixes the operational current is fixed to 20 mA. In FIG. 3, curbs p, q and r, which correspond to the current injection area of 3×10$^{-4}$ cm$^2$, 5–10$^{-4}$ cm$^2$, and 6×10$^{-4}$ cm$^2$, respectively, are shown. The current injection area corresponds to an area shown by hatched lines in FIG. 1b. That is, the current injection area corresponds to an area not overlapping the n-GaN current block layer 9 in the p-side electrode 10.

As shown in FIG. 3, the larger the current injection area is, the smaller the optical output becomes. When a thickness of the active layer is thinner than the diffusion length, the optical output drastically drops. It is predicted that the reason is because the carriers overflows (saturates). However, in FIG. 2, because the saturated tendency is not shown, the reason why the carriers overflow is not correctly explained.

As a reason why the optical output drastically drops when a thickness of the active layer is small, it is conceivable that a crystal quality of GaN is not good at an initial state of crystal growth and an interface property between the active layer 5 and the clad layers 4, 6 is not good. It is predicted that these are due to a crystal growth at lattice mismatch. However, a certain reason is yet unknown.

Figure 4:
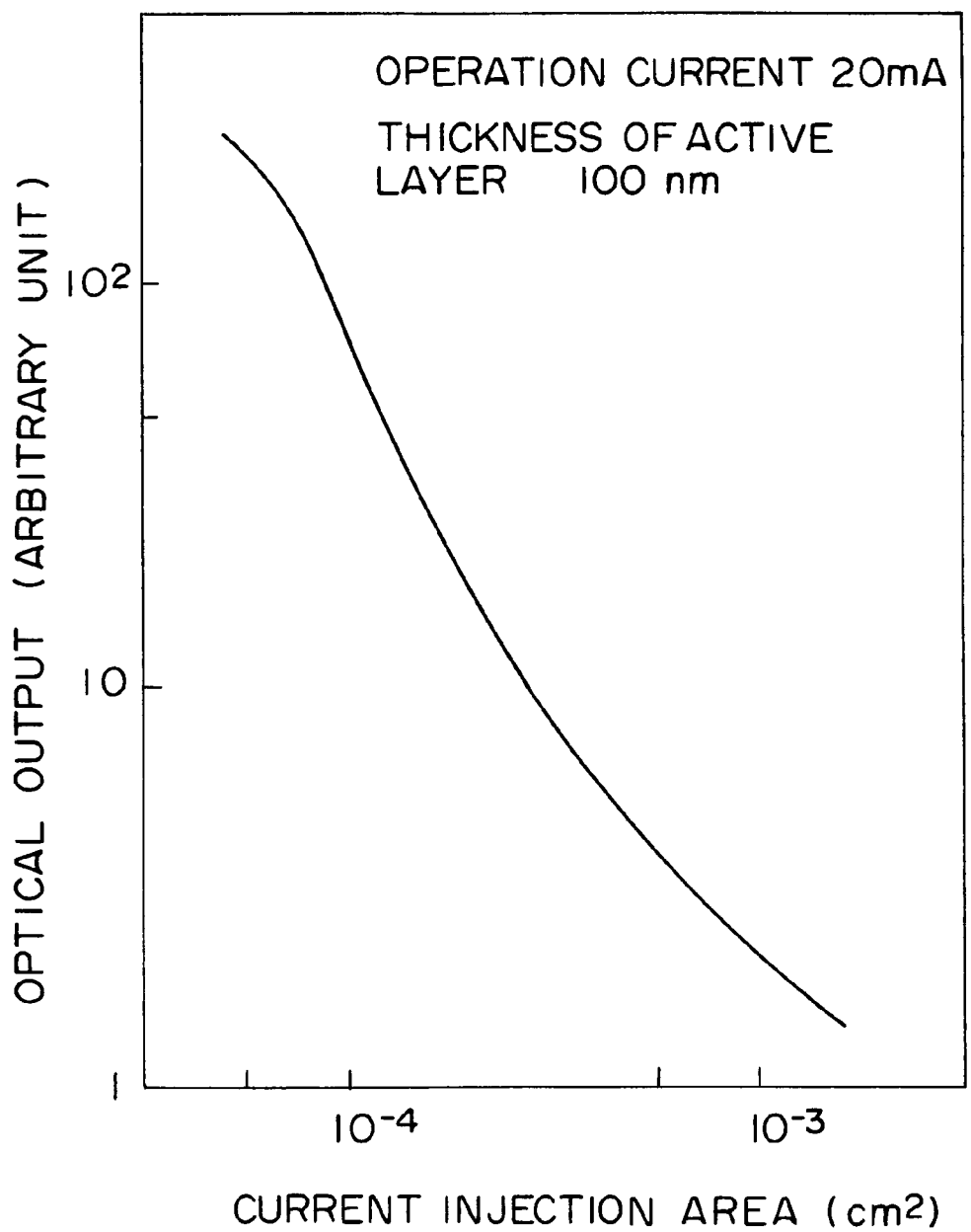
FIG. 4 is a diagram showing a relationship between the current injection area and the optical output.

On the other hand, the properties of the optical output for variation of the current injection area is as expected. FIG. 4 is a diagram showing a relationship between the current injection area and the optical output. FIG. 4 shows an example in which the operational current is fixed to 20 and a thickness of the active layer is fixed to 100 nm. As shown in FIG. 4, the smaller the current injection area is, the larger the optical output becomes. Accordingly, it is understood that the current injection area should be as small as possible.

In view of both properties of FIG. 3 and FIG. 4, in ultraviolet emission LED of which the active layer 5 is GaN, a thickness of the active layer should be equal to or more than 50 nm and the current injection area should be equal to or less than 5×10$^{-4}$ cm$^2$ in order to allow lights to efficiently emit. More desirably, a thickness of the active layer should be equal to or more than 100 nm and the current injection area should be equal to or less than 1×10$^{-4}$ cm$^2$.

FIGS. 5a –5j is a diagram showing steps for manufacturing the semiconductor light emitting diode of FIG. 1. Hereinafter, the steps for manufacturing the semiconductor light emitting diode according to the first embodiment will be explained with reference to FIG. 5.

Figure 5A:
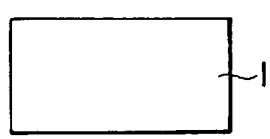
FIGS. 5a–5j is a diagram showing steps for manufacturing the semiconductor light emitting device of FIG. 1.
Figure 5B:
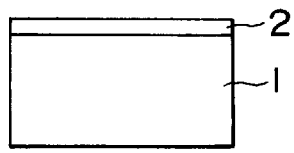

First of all, as shown in FIG. 5a, a sapphire substrate is cleaned for 10 minutes at 1100° C. under hydrogen atmosphere. Next, the substrate temperature is lowered to 500° C., and then the buffer layer 2 is formed by supplying a hydrogen carrier gas including materials for crystal growth, as shown FIG. 5b.

Figure 5C:
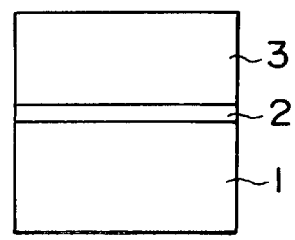
Figure 5D:
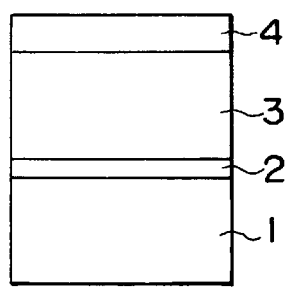

Next, on condition that the temperature of the substrate is raised to 1050° C., then-GaNcontact layer 3 is formed by supplying a hydrogen gas including TMG, NH3 and SiH4, as shown in FIG. 5c. Next, on condition that the temperature of the substrate is set to 1050° C., the n-AlGaN clad layer 4 is grown by supplying a hydrogen gas including TMG, TMA, NH$_3$ and SiH$_4$, as shown in FIG. 5d.

Figure 5E:
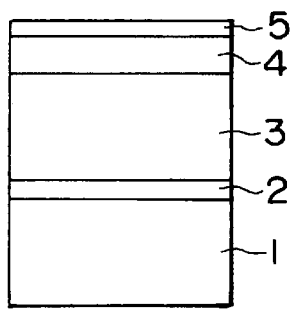
Figure 5F:
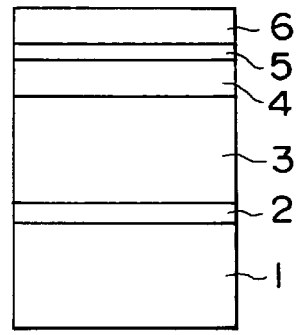

Next, on condition that the temperature of the substrate is set to 1050° C., the GaN active layer 5 is formed by supplying a hydrogen gas including TMG and NH3, as shown in FIG. 5e. Next, on condition that the temperature of the substrate is set to 1050° C., the p-AlGaN clad layer 6 is formed by supplying a hydrogen carrier gas including TMG, TMA, NH$_3$, Cp$_2$Mg, as shown in FIG. 5f.

Figure 5G:
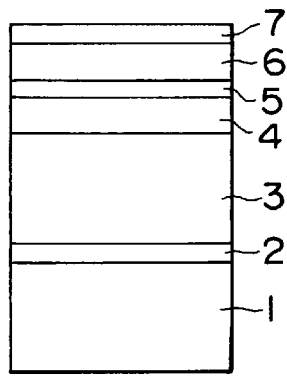
Figure 5H:
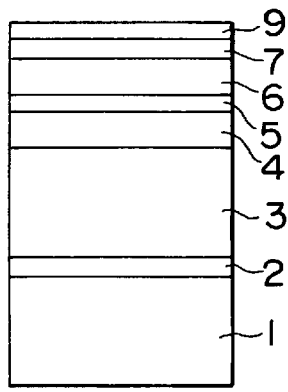

Next, on condition that the temperature of the substrate is set to 1050° C., the p-GaN contact layer 7 is formed by supplying a hydrogen carrier gas including TMG, NH$_3$ and Cp$_2$Mg, as shown in FIG. 5g. Next, on condition that the temperature of the substrate is set to 1050° C., the n-GaN current block layer 9 is formed by supplying a hydrogen carrier gas including TMG, NH$_3$ and SiH$_4$, as shown in FIG. 5h.

Figure 5I:
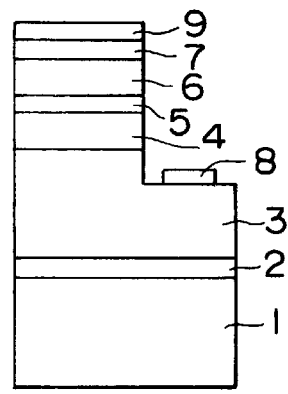
Figure 5J:
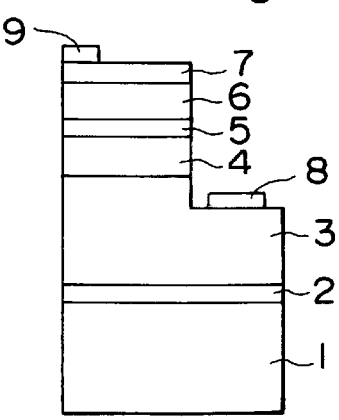

Next, a portion of the n-GaN contact layer 3 is exposed by etching the clad layer 4, the GaN active layer 5, the clad layer 6, the p-GaN contact layer 7 and the n-GaN current block layer 9. Next, the n-side electrode 8 is formed on the upper face of the exposed n-GaN contact layer 3, as shown in FIG. 5i. Next, the n-GaN current block layer 9 is etched so that the p-GaN contact layer 7 is exposed, except for a portion of the layer 9. And then the p-side electrode 10 is formed on the upper face of the exposed p-GaN contact layer 7, as shown in FIG. 5j.

In the first embodiment, a thickness of the GaN active layer 5 shown in FIG. 1 is set to 100 nm, a thickness of the clad layers 4 and 6 is set to 0.2 $\mu$m, and a wave length for light emission is set to 365 nm. However, the film thickness and the wave length are not limited to the above-mentioned values.

For instance, as an example applicable without missing an effect of the present invention, the following examples are conceivable.

1) The active layer 5 is made of InxGa1-xN where a constituent ratio x of indium (In) is 0.1. Each thickness of the clad layers 4 and 6 including AlyGa1-yN is 0.2 μm. A mix crystal ratio y of Al is set to 0.1. In this case, the wave length for light emission is 390 nm.

2) The active layer 5 is made of InzGa1-zN where an aluminum (Al) composition z is 0.1. Each thickness of the clad layers 4 and 6 including AlyGa1-yN is 0.2 μm. A mix crystal ratio y of Al is set to 0.25. In this case, the wave length for light emission is 345 nm.

In the above-mentioned embodiment, each layer for constituting the semiconductor light emitting diode is formed by MOCVD method. Gases of raw materials used in this example are not limited to the above-mentioned gas. For example, trimethyl indium or triethyl gallium as a gallium source, trimethyl indium or triethyl indium as a indium source, trimethyl aluminum or triethyl aluminum as a aluminum source, and ammonia or hydrazine as a N source may be used. Furthermore, although the present embodiment has used mono silane as n type impurity and bis cyclopenta dienyl magnesium as p type impurity, other type of impurities may be used.

Figure 6:
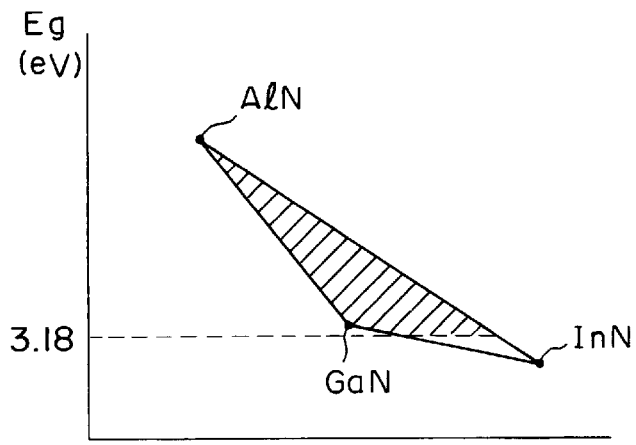
FIG. 6 is a diagram showing a relationship between a lattice constant 'a' and a band-gap energy Eg.

Hereinafter, materials of -the active layer 5 will be explained in detail. FIG. 6 is a diagram showing a relationship between a lattice constant 'a' and a band-gap energy Eg. In FIG. 6, characteristic points of GaN, InN and AlN are connected by straight lines.

In the present embodiment, it is desirable to use materials existing in a region enclosed by the straight lines and having the band-gap energy Eg (eV) equal to or more than 3.18 eV.

Thus, in the first embodiment, a thickness of the active layer is set to be equal to or more than 50 nm and the current injection area is set to be equal to or less than $5 \times 10^{-4}$ cm$^2$ in accordance with the properties of the optical output for the current injection area. Accordingly, it is possible to obtain the ultraviolet LED of which the emission efficiency is higher than the conventional LED.

Second Embodiment

Figure 7A:
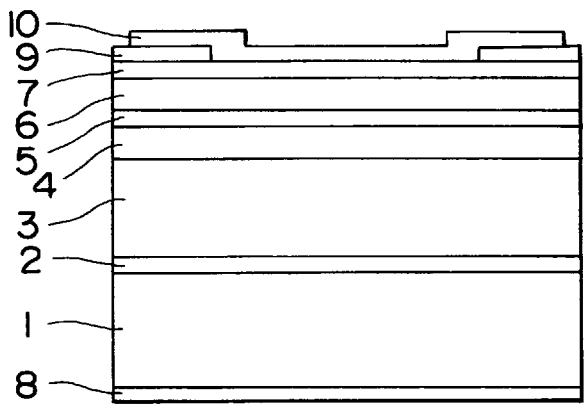
FIG. 7a is a cross sectional view of a second embodiment.
Figure 7B:
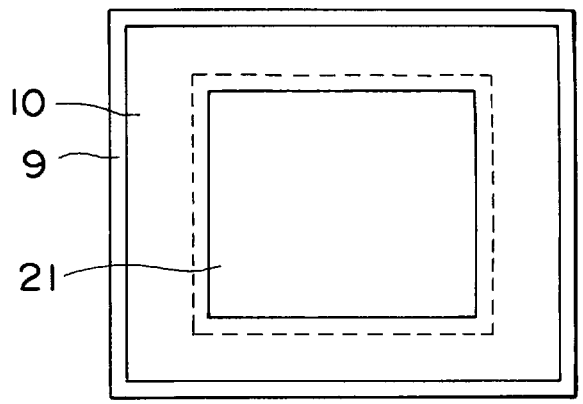
FIG. 7b is a top view of the second embodiment.

FIG. 7a is a cross sectional view of a second embodiment of a semiconductor light emitting diode according to the present invention, and FIG. 7b is a top view of the second embodiment. The semiconductor light emitting diode of FIG. 7 has the same structure as that of FIG. 1, except for materials of the substrate and arrangement of the electrodes. Hereinafter, steps for manufacturing the device of FIG. 7 will be explained.

First of all, a buffer layer 2, an n-GaN contact layer 3, a clad layer 4 including n-AlGaN (n-AlyGa1-yN), a GaN active layer 5, a clad layer including p-AlGaN (p-AlyGa1-yN), and a p-GaN contact layer 7 is laminated in this order on the GaN substrate 1.

Next, an n-GaN current block layer 9 is formed on the p-GaN contact layer 7, and then a portion of the GaN current block layer 9 is eliminated so that the p-GaN contact layer 7 is exposed.

Next, a p-side electrode 10 is formed on the exposed p-GaN contact layer 7 and the n-GaN current block layer 9 overlapping with the p-GaN contact layer 7. Furthermore, an n-side electrode 8 is formed on a lower face of the GaN substrate 1. A central portion 21 of FIG. 7b corresponds to the current injection region.

In the semiconductor light emitting diode of FIG. 7, the p-side electrode 10 is formed on the upper face side of the GaN substrate 1, and the n-side electrode 8 is formed on the lower face side of the GaN substrate 1. Because of this, a path that the current flows becomes short; as a result, a resistance of the semiconductor light emitting diode of FIG. 7 becomes lower than that of FIG. 1. Accordingly, it is possible to feed more current than that of FIG. 1. Because an etching process is unnecessary to form the n-side electrode 8, it is possible to simplify steps for manufacturing.

In each of the above-mentioned embodiments, the n-GaN current block layer 9 is formed on the p-GaN contact layer 7. However, when the p type region make contact with then type region, the carriers in the p type region are activated, and the current is easy to flow because the resistance becomes lower. Furthermore, because the area per one chip of the LED becomes small, it is possible to increase the number of the LEDs per one wafer.

It is always unnecessary to form the n-GaN current block layer 9 on the p-GaN contact layer 7; for example, a SiO$_2$ layer may be formed, instead of the p-GaN contact layer 7.

In the above-mentioned embodiments, an example that the operational current is 20 mA has been explained. However, the operational current is not limited to the above-mentioned value. Even if the operational current changes, if a thickness of the active layer is equal to or more than 50 nm and the current injection area is equal to or less than $5 \times 10^{-4}$ cm$^2$, it is possible to improve the light emission efficiency as well as the above-mentioned embodiment.

Furthermore, in the above-mentioned embodiments, an example using the GaN as the active layer 5 has been explained. However, even in the case that mix crystal of InxGa1-xN where x is values which gets rid of a non-mixed region, or mix crystal of AlGaN is used, it is possible to obtain the same effect. In case that the active layer 5 is made of mix crystal of InxGa1-xN, it is desirable to set the constituent ratio x to $0 \leq x \leq 0.1$. Furthermore, in case that the active layer 5 is made of the mix crystal, it is desirable to set the constituent ratio x to $0 \leq x \leq 1$.

Furthermore, in case of changing parameters which decide conditions for injection of the impurity doped in the active layer 5 and properties of AlyGa1-yN clad layer 4 and 6, such as Al mix crystal ratio y, film thickness and carrier concentration, it is desirable to convert the parameters into other values such as film thickness and film materials.

What is claimed is:

1. A semiconductor light emitting device, comprising:
   an active layer in a thickness equal to or more than 50 nm; and
   a semiconductor including nitride which has a stacked structure and is arranged at both sides of said active layer,
      wherein a current injection area of said semiconductor including nitride is equal to or less than $5 \times 10^{-4}$ cm$^2$, and
      lights are emitted due to a transition of band-to-band of said active layer.

2. The semiconductor light emitting device according to claim 1,
   wherein said active layer is made of a nitride which comprises at least one of indium (In), gallium (Ga), aluminum (Al), and Boron (B).

3. The semiconductor light emitting device according to claim 1,
   wherein a band-gap energy Eg (eV) of said active layer is equal to or more than 3.18 eV.

4. The semiconductor light emitting device according to claim 2, wherein said active layer is made of InxGa1-xN (0≦x≦0.1).

5. The semiconductor light emitting device according to claim 2,
wherein said active layer is made of AlxGa1-xN (0<x≦1).

6. The semiconductor light emitting device according to claim 2,
wherein a constituent ratio of each material constituting said semiconductor including nitride is set so that lights in an ultraviolet wave length is emitted.

7. The semiconductor light emitting device according to claim 6,
wherein said active layer is made of InxGa1-xN in a thickness of 100 nm where a constituent ratio x of indium (In) is 0.1.

8. The semiconductor light emitting device according to claim 6,
wherein said active layer is made of AlzGa1-zN in a thickness of 100 nm where a constituent ratio z of aluminum (Al) is 0.1.

9. A semiconductor light emitting device, comprising:
a buffer layer formed on a sapphire substrate;
an n-GaN contact layer formed on said buffer layer;
an n-AlGaN clad layer formed on said n-GaN contact layer;
an active layer formed on said n-AlGaN clad layer;
a p-AlGaN clad layer formed on said active layer;
a p-GaN contact layer formed on said p-AlGaN clad layer;
a current block layer formed on a portion of said p-GaN contact layer;
an n-side electrode formed on said n-GaN contact layer, said n-side electrode being separated from said n-AlGaN clad layer; and
a p-side electrode formed on said p-GaN contact layer and said current block layer,
wherein a thickness of said active layer is equal to or more than 50 nm, and
said p-side electrode has an area equal to or less than $5 \times 10^{-4}$ cm$^2$, except for a region overlapping with said n-GaN current block layer.

10. The semiconductor light emitting device according to claim 9,
wherein said active layer is a GaN active layer in a thickness of 100 nm, and
both of said n-AlGaN clad layer and said p-AlGaN clad layer are made of AlyGa1-yN in a thickness of 0.2 im where a mix crystal ratio y of aluminum (Al) is 0.2.

11. The semiconductor light emitting device according to claim 9,
wherein said active layer is made of InxGa1-xN in a thickness of 100 nm where a constituent ratio x of indium (In) is 0.1, and
both of said n-AlGaN clad layer and said p-AlGaN clad layer are made of AlyGa1-yN in a thickness of 10.1 im where a mix crystal ratio y of aluminum (Al) is 0.1.

12. The semiconductor light emitting device according to claim 9, wherein said active layer is formed of an AlzGa1-zN in a thickness of 100 nm where a constituent ratio z of aluminum (Al) is 0.1, and
both of said n-AlGaN clad layer and said p-AlGaN clad layer are made of AlzGa1-zN in a thickness of 0.2 im where a mix crystal ratio z of aluminum (Al) is 0.25.

13. The semiconductor light emitting device according to claim 9,
wherein said current block layer is made of n-GaN or silicon oxide.

14. A semiconductor light emitting device, comprising:
a buffer layer formed on an upper face of a GaN substrate;
an n-GaN contact layer formed on said buffer layer;
an n-AlGaN clad layer formed on said n-GaN contact layer;
an active layer formed on said n-AlGaN clad layer;
a p-AlGaN clad layer formed on said active layer;
a p-GaN contact layer formed on said p-AlGaN clad layer;
a current block layer formed on a portion of said p-GaN contact layer;
a p-side electrode formed on said p-GaN contact layer and said current block layer; and
an n-side electrode formed on a lower face of said GaN substrate, said lower face being oppositely arranged for said buffer layer by sandwiching said GaN substrate,
wherein a thickness of said active layer is equal to or more than 50 nm, and
said p-side electrode has an area equal to or less than $5 \times 10^{-4}$ cm$^2$, except for a region overlapping with said n-GaN current block layer.

15. The semiconductor light emitting device according to claim 14,
wherein said active layer is formed of GaN in a thickness of 100 nm, and
both of said n-AlGaN clad layer and said p-AlGaN clad layer are made of AlyGa1-yN in a thickness of 0.2 im where mix crystal y of aluminum (Al) is 0.2.

16. The semiconductor light emitting device according to claim 14,
wherein said active layer is made of InxGa1-xN in a thickness of 100 nm where a constituent ratio x of indium (In) is 0.1, and
both of said n-AlGaN clad layer and said p-AlGaN clad layer are made of AlyGa1-yN in a thickness of 0.1 im where a mix crystal ratio y is 0.1.

17. The semiconductor light emitting device according to claim 14,
wherein said active layer is made of AlzGa1-zN in a thickness of 100 nm where a constituent ratio z is 0.1, and
both of said n-AlGaN clad layer and said p-AlGaN clad layer are made of AlzGa1-zN in a thickness of 0.2 im where a mix crystal z of aluminum (Al) is 0.25.

18. The semiconductor light emitting device according to claim 14,
wherein said current block layer is made of n-GaN or silicon oxide.

* * * * *